United States Patent [19]

Troukens

[11] 4,222,036
[45] Sep. 9, 1980

[54] PROCESS FOR ASSEMBLY OF COMPONENTS ON PRINTED CARDS WITH THE USE OF A POSITION-LOCATING AID

[75] Inventor: Theodor Troukens, Oostkamp, Belgium

[73] Assignee: Siemens Aktiengesellschaft, Berlin & Munich, Fed. Rep. of Germany

[21] Appl. No.: 4,059

[22] Filed: Jan. 17, 1979

[51] Int. Cl.² .............................................. G08B 5/38
[52] U.S. Cl. ............................ 340/286 M; 340/734; 340/747; 340/705; 29/407; 29/720; 353/28; 356/394
[58] Field of Search ............... 29/626, 407, 720, 721, 29/428; 364/491; 353/28, 122, 121; 350/30; 356/392, 393, 394; 340/286 M, 705, 723, 734, 747

[56] References Cited
U.S. PATENT DOCUMENTS

| | | | |
|---|---|---|---|
| 3,112,354 | 11/1963 | Urias et al. | 356/392 |
| 3,667,104 | 6/1972 | Chamillard et al. | |
| 4,005,939 | 2/1977 | Stavalone | 350/30 X |
| 4,102,568 | 7/1978 | Miyagi | 29/720 X |
| 4,105,340 | 8/1978 | Kempf | 356/392 X |
| 4,163,309 | 8/1979 | Stückler | 29/407 |

FOREIGN PATENT DOCUMENTS 2006320 2/1971 Fed. Rep. of Germany .
913338 12/1962 United Kingdom .

Primary Examiner—Francis S. Husar
Assistant Examiner—C. J. Arbes
Attorney, Agent, or Firm—Hill, Van Santen, Steadman, Chiara & Simpson

[57] ABSTRACT

A method is disclosed for assembling components on printed cards with the use of a position-locating aid. This position-locating aid preferably comprises a display system which indicates receiving holes in the card for connection wires of particular components to be mounted according to a predetermined mounting program. A line or lines consisting of points of light are projected between the receiving holes. The line or lines form a plan or symbol representing the particular type of component to be mounted. The plan or symbol is repeatedly projected at a sufficient frequency so that a fixed image appears to a viewer who is assembling the components.

6 Claims, 4 Drawing Figures

PROCESS FOR ASSEMBLY OF COMPONENTS ON PRINTED CARDS WITH THE USE OF A POSITION-LOCATING AID

BACKGROUND OF THE INVENTION

The invention relates to a process for the assembly of components on electric printed cards with the use of a position-locating aid that operates electrically, and which controls a point of light projected onto the printed card which serves as the basis for the equipment according to a predetermined assembly program. The control of the point of light occurs such that it indicates by a dotted connection line the receiving hole in the printed card for the component connection wires of the component to be assembled. To insure that the component is placed in the circuit in the correct position with regard to its polarity, it is known to mark the preferred receiving hole in the printed card by means of a varying dwell time for the point of light.

Such a previously known position-locating aid and process, however, has the disadvantage that from the display of the point of light it cannot be determined which kind of component is to be inserted at the indicated assembly location between the marked receiving holes for the connection wires of a component. Therefore, it has already been proposed to project an image of the component, for example of its outline, onto the connection location between the receiving holes for the connecting wires by means of a projector, so that the operator could immediately see what type of component is to be inserted at the indicated equipping location. Such a display installation, however, is expensive in terms of both time and cost.

A further disadvantage also consists in that such an installation, because of the large variation and varying positions of the various component parts on the printed card, produces difficulties in stocking and storing the projection images. The installation takes up too much space. Should one wish to avoid this, then there is the possibility of copying the individual projection images on a film and projecting the individual images in succession onto the printed card. Such a process, however, is not only expensive in terms of cost and time for producing the film, but there is also the disadvantage that a change in the equipping program can be implemented only with difficulty.

SUMMARY OF THE INVENTION

Proceeding from the process discussed above, one avoids the disadvantages in that according to the invention, one controls the dotted connection line between the receiving holes according to plan or symbolic form of the component to be mounted, and in so doing, reproduces the plan or the symbol of the component to be mounted many times within a given unit of time so that a fixed image appears for the viewer.

By means of this inventive process, a significant simplification with a carefully directed assembly is possible so as to reduce the rejection quota. So that a fixed image appears, the plan view or symbolic form is cyclically repeated, preferably 50 times a second, between the receiving holes for the connection wires of the components. Based on the plan or symbolic form of the component, it is now not difficult for the worker to recognize what component, for example, a resistor, a transistor, a capacitor or an integrated circuit, is to be assembled at that moment. The image projected onto the printed card is maintained in such manner that the contour lines are tangential with or intersect the respective receiving holes for the connection wires of the components. If one wishes to specially emphasize a polarity location for the component, then one marks the preferred receiving hole with a lesser frequency of the point of light than the image of the component part such that, compared with the fixed image of the plan or symbolic form of the component, the preferred receiving hole in the printed card appears as a flashing polarity indicator in the light design.

So that the plan outline or symbolic form appears on the printed card as a closed continuous line, it is provided in a further feature of the invention that one projects the continuous line onto the printed card by means of a multitude of individual points of light which overlap one another. It often occurs that different components exhibit the same plan or symbolic form. As a safeguard in that case, one also separately indicates the assembly number and/or type number on the component in the field of vision of the worker in addition to the indication of the plan or symbolic form.

DESCRIPTION OF THE PREFERRED EMBODIMENTS

Figure 1:
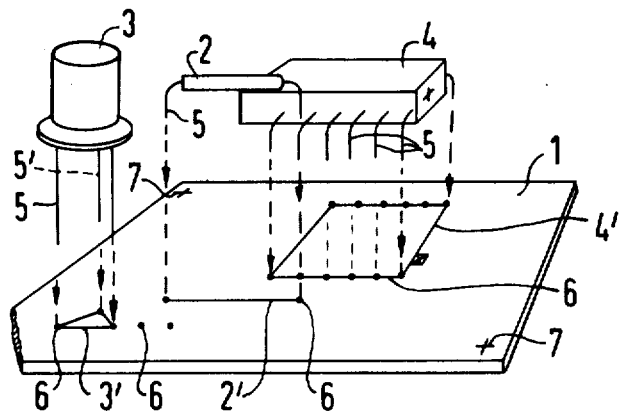
FIG. 1 is a perspective view of a printed circuit card on which components are to be assembled at locations identified by connection lines forming a symbol representative of the component to be assembled thereat.

A resistor 2, a transistor 3 and a module 4 are to be successively contacted on a printed card 1. To this end, the respective connection wires or elements 5 are conveyed through the contact holes 6 placed in the printed card. The printed card has positioning marks 7 and is movably seated on a cross-table support not illustrated here. The locations at which the connection wires or connection elements 5, respectively, of the individual components are to be inserted in the receiving holes 6 are to be indicated. To this end, beginning with the adjusting marks 7 and by means of three positioning spindles (x; y and rotation) that can be adjusted by hand, the printed card is made to coincide with three projected adjusting marks and, thus, the card is brought into the assembling position. By means of a light projector illustrated in FIG. 4, a symbol that is dependent on the component type is projected by means of a light beam onto the printed card in the assembly position assumed. Thus, for example, the symbol for the module 4 is a rectangle 4', the symbol for the resistance 2 is a line 2', the sumbol for the transistor 3 is a triangle 3'. The projection of the symbol or also, respectively, or the plan of the component ensues such that the indicated symbolic form, namely the continuous line, proceeds at the receiving holes for the reception of the connection wires. In addition to the Figures shown, as symbols one uses star-shaped characters for components which have a plurality of connections, a continuous line with a polarity symbol on one side, for example, for a capacitor, a continuous line with end points for a resistor, etc.

Figure 2:
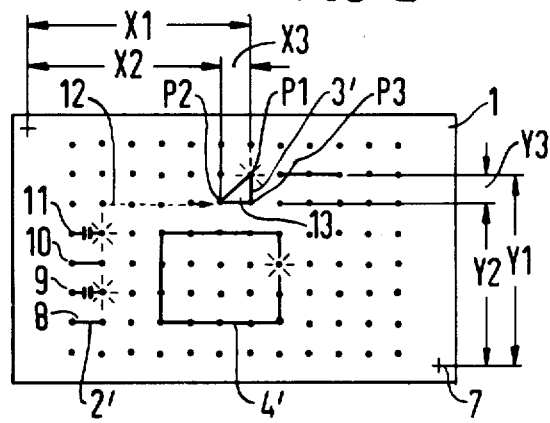
FIG. 2 is a plan view of the printed circuit board with the component symbols projected thereon in accordance with the invention.

As shown particularly in FIG. 2, for the projection of a circuit symbol 3', for example, the projection midpoint P1 is targeted in accord with the coordinates X1, Y1. Now, a light beam in accordance with the coordinates (−Y3), (−X3), (+X3), (+Y3) is projected with high speed by a projector. Each cycle lasts about 1/50 of a second. Thus, a fixed image of, in the present case, a triangle arises for the viewer, whose corners mark the respective receiving holes for the connection wires 5 of a transistor 3. The polarity is essential for a transistor. To indicate the position of the emitter of the transistor, the point of light above the coordinates belonging to the receiving hole 6 (in point P1) is deflected by a small distance $\Delta Y$ after each tenth cycle (FIG. 3), so that a flashing signal appears here for the viewer next to the receiving hole. It is also possible to generate a flashing light immediately above the receiving hole in a corresponding manner. When the connection wire of the base 5' for the transistor 3 (FIG. 1) is inserted in the receiving hole at P1, then in a specific transistor the introduction location for the connection wire of the collector and of the emitter for the receiving holes P2 and P3 is given. One proceeds similarly in the other component parts. It is understood that one selects the assembling program such that after mounting a component, for example, a resistor 8, one successively indicates the other components and inserts the component elements one after the other and with the shortest possible hand movements of the assembler. For example, a capacitor 9, a resistor 10, and a further capacitor 11 may be assembled, and then, following the broken line 12, advances to the mounting position 13 for the transistor for assembly thereat.

Figure 3:
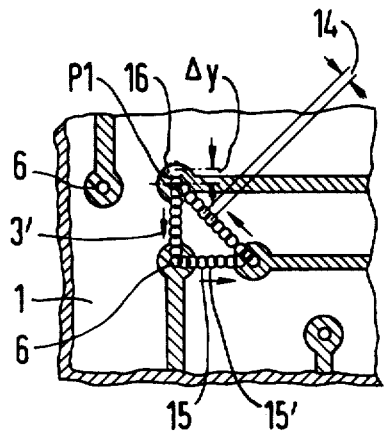
FIG. 3 is a fragmentary expanded view of the printed circuit card illustrating the formation of connecting lines.

As can be seen particularly from FIG. 3, one indicates the symbol 3' or the plan of the component element on the printed card by means of the light beam 14 as a chain of successive, individual points of light 15, 15', etc. Each point of light has a diameter of about 1 mm. The individual points of light are projected in overlapping fashion; therefore a closed continuous line arises for the viewer. If, for example, one wishes to indicate a polarity at point P1, then one advantageously displaces one of the points of light—as is indicated with the broken line at 16—by the distance $\Delta y$ from the continuous line. With figure lengths up to 50 mm, one draws the continuous line with a frequency of 50 Hz or at a minimum of 16 Hz. Below this threshold, no stable formation occurs for the viewer. For point 16, one selects a frequency of, for example, 5 Hz. At each tenth cycle, one deflects the galvanometer mirror by one or two further increments, so that in this case a flashing point in comparison to the fixed symbol appears at 16.

Figure 4:
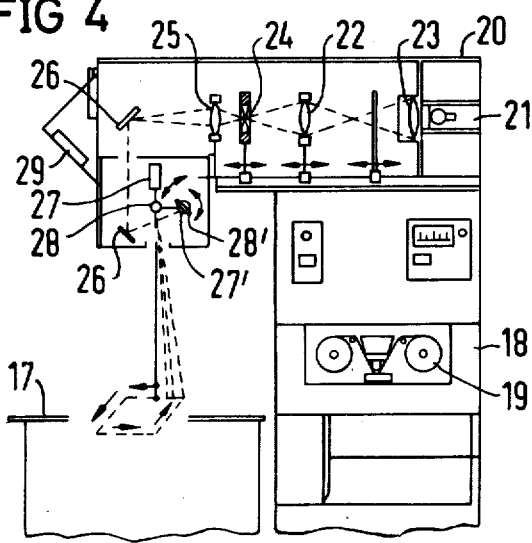
FIG. 4 is a side view of an apparatus for projecting a controllable beam of light which projects the symbols onto the printed circuit card.

FIG. 4 shows the schematic design for the assembly arrangement. The cross-table support with the component which is not illustrated here, is located on a work table 17. The control electronics utilizing a punched tape reader 19 for the program are housed in a box support 18. A cross-arm 20 contains a halogen lamp 21 with the appropriate lens 22, condenser 23, aperture 24, achromatic lens 25, passive reflectors 26, 26' and the galvanometer mirrors 28 and 28' controlled via galvanometer motors 27, 27' by a microcomputer not illustrated here. Such individual components are known per se and are not each the subject matter of this invention. A display 29 which displays the respective number of the component to be mounted is arranged on a facing wall of the cross-arm.

Although various minor modifications may be suggested by those versed in the art, it should be understood that I wish to embody within the scope of the patent warranted hereon, all such embodiments as reasonably and properly come within the scope of my contribution to the art.

I claim:

1. A method for assembly of components on electrical printed cards with the use of a position-locating aid which operates electrically and which controls a point of light which forms a dot projected onto the printed card in accordance with a predetermined assembly program, comprising the step of: moving the point of light such that at least one connection line is formed by a series of dots between receiving holes placed in the printed card for connection wires of components to be mounted, wherein the dotted connection lines between the receiving holes form an identifying symbol for each particular component being assembled, and wherein the symbol is projected a sufficient number of times in a unit of time so that a fixed image appears for a viewer who is assembling the components.

2. A method according to claim 1 including the step of projecting the points of light so that adjacent dots mutually overlap when forming the at least one connection line so as to present a continuous line to the viewer.

3. A method according to claim 1 wherein the connection lines of the symbol are projected on the printed card at least 16 times per second.

4. A method according to claim 1 including the step of indicating a polarity of a particular component to be mounted by projecting a symbol for the polarity with a frequency of projection smaller than a frequency of projection for the component symbol by an amount sufficient to make the polarity symbol appear to flash.

5. A method according to claim 1 wherein the connection lines of the symbol approximately represents an outline of at least some of the particular components.

6. A method for indicating to an assembler of components on an electrical printed circuit card the location and type of components to be assembled on the printed cards, comprising the steps of: providing a printed card having a plurality of component connection holes therein; projecting a light beam onto the printed card so as to form a light dot thereon; deflecting the beam of light in a pre-programmed manner so as to form a series of adjacent dots which appear to a viewer to constitute a continuous line on the printed card; projecting said continuous lines between the receiving holes for the component connecting wires so as to form by said lines a symbol which is distinct for each particular component to be mounted; and repeating the projection of the lines so as to form the particular symbols a sufficient number of times so that the symbol appears to be a continuous image to the viewer.

* * * * *